United States Patent
Saeki

(10) Patent No.: US 8,427,222 B2
(45) Date of Patent: Apr. 23, 2013

(54) CURRENT DRIVING CIRCUIT

(75) Inventor: Yutaka Saeki, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/410,132

(22) Filed: Mar. 1, 2012

(65) Prior Publication Data

US 2012/0212261 A1 Aug. 23, 2012

Related U.S. Application Data

(62) Division of application No. 12/458,593, filed on Jul. 16, 2009, now Pat. No. 8,159,279.

(30) Foreign Application Priority Data

Jul. 8, 2008 (JP) .................. 2008-187083

(51) Int. Cl.
*H03L 5/00* (2006.01)
(52) U.S. Cl.
USPC ............ 327/328; 327/109; 327/108; 327/538
(58) Field of Classification Search .................. 327/328, 327/109, 108, 538
See application file for complete search history.

(56) References Cited

U.S. PATENT DOCUMENTS

| | | | |
|---|---|---|---|
| 5,990,671 A * | 11/1999 | Nagata | 323/313 |
| 6,653,891 B1 * | 11/2003 | Hazucha | 327/540 |
| 6,879,534 B2 * | 4/2005 | Perner et al. | 365/209 |
| 7,176,910 B2 * | 2/2007 | Tsuchi | 345/204 |
| 7,265,607 B1 * | 9/2007 | Rajapandian et al. | 327/541 |
| 2002/0145412 A1 * | 10/2002 | Kato | 323/316 |
| 2004/0155892 A1 * | 8/2004 | Tsuchi | 345/690 |
| 2006/0181361 A1 * | 8/2006 | Van De Gevel et al. | 331/158 |

FOREIGN PATENT DOCUMENTS

| | | |
|---|---|---|
| JP | 2-128205 | 5/1990 |
| JP | 2000-278107 | 10/2000 |

* cited by examiner

*Primary Examiner* — Ryan Jager
(74) *Attorney, Agent, or Firm* — McGinn IP Law Group, PLLC

(57) ABSTRACT

A current driving circuit includes a constant current source circuit delivering a driving current to a load, and an output voltage difference amplifier circuit detecting a voltage change produced at a load driving end during a preset time period and delivering a current or a voltage corresponding to the voltage change to the load during a time period different from the preset time period. During first time period, capacitance circuit compares potential during a preceding time period to that during the current time period, and causes a potential at the load driving end during the current time period to store in any of capacitance elements depending on result of comparison. The amplifier circuit buffering an average value of the potential values stored in the capacitance elements during the second time period following the first time period, to deliver the average value to the load.

9 Claims, 14 Drawing Sheets

CURRENT DRIVING CIRCUIT

REFERENCE TO RELATED APPLICATION

The present application is a Divisional Application of U.S. patent application Ser. No. 12/458,593 filed on Jul. 16, 2009, now U.S. Pat. No. 8,159,279 which is based on Japanese Patent Application No. 2008-187083, filed on Jul. 18, 2008 the entire contents of which is incorporated herein by reference.

TECHNICAL FIELD

This invention relates to a current driving circuit and, more particularly, to a circuit for current-driving a load exemplified by a pixel transistor in a display device.

BACKGROUND

In an organic EL (electro-luminescence) panel, an organic EL element, arranged for each pixel, emits light to display a picture on a panel. The method for displaying a pixel may be classified into (1) a method by voltage driving and (2) a method by current driving. With the method by voltage driving, the voltage is applied to a transistor of each pixel. This transistor transforms the voltage into the current which current then flows through an organic EL element to emit light. With the method by current driving, the current is delivered to the transistor of each pixel. A current proportionate to the so delivered current then flows through the organic EL element of each pixel to emit light. In the case of the voltage driving, the current flowing through the organic EL element undergoes variations due to manufacture tolerances of the transistor of each pixel when the latter transforms the voltage into the current. Hence, the current driving is higher in accuracy than the voltage driving. However, with the current driving, it is necessary to deliver the current to a panel load to each pixel in addition to the current to be delivered to the transistor of each pixel. Hence, the smaller the current value, the longer is the time involved in driving.

The technique for enhancing the driving performance is disclosed in Patent Document 1. FIG. 13 depicts a block diagram of a current driving circuit disclosed in Patent Document 1. Referring to FIG. 13, the current driving circuit includes a current source 102 that drives a capacitive load 101 and an over-drive circuit 103, which is provided apart from the current source 102 to operate as a startup circuit for driving the capacitive load 101. The over-drive circuit 103 is controlled by an output of a band-gap voltage driving circuit 104 that detects the voltage of a load driving terminal 100. With a threshold value of, for example, 2.6V for a detection voltage of the load driving terminal 100, the current is supplied from both the current source 102 and the over-drive circuit 103 if the load terminal voltage is less than 2.6V. If the load terminal voltage is not less than 2.6V, the current from the over-drive circuit 103 is cut off such that only the current from the current source 102 is delivered. The startup response characteristic may thus be improved by the driving of only the current source 102 without changing the current value of the driving current (current value of the current source 102).

Meanwhile, as a related technique, a current limiting circuit, operating in stability against changes in the power supply voltage and in the operating temperature, is disclosed in Patent Document 2.

[Patent Document 1]
    JP Patent Kokai Publication No. JP-P2000-278107A
[Patent Document 2]
    JP Patent Kokai Publication No. JP-A-02-128205

SUMMARY

The entire disclosures of the above Patent Documents are incorporated herein by reference thereto. Now, the following analyses are given by the present invention.

With the current driving circuit of Patent Document 1, there is provided a band-gap voltage detection circuit that detects a reference voltage. This detection circuit operates satisfactorily only in case a reference voltage value is detected at high accuracy when the current of a desired value is delivered to a panel load side.

FIGS. 14A and 14B show an equivalent circuit for a load corresponding to organic EL elements etc. Referring to FIG. 14A, a load is made up by a line of distributed constant termed "distributed constant line" and an Nch transistor MTr. The distributed constant line, in turn, is made up by capacitance components c and resistance components r corresponding to a panel interconnect load. The Nch transistor MTr corresponds to a pixel load connected in series with the panel interconnect load. Referring to FIG. 14B, a load is made up by a distributed constant line and an Nch transistor MTra. The distributed constant line, in turn, is made up by capacitance components c and resistance components r corresponding to a panel interconnect load. The Nch transistor MTr corresponds to a pixel load connected in series with the panel interconnect load. It is observed that the capacitance components c, resistance components r and the threshold voltages of the transistors MTr and MTra suffer variations due to manufacture tolerances, as is well known.

Thus, even with overdriving based on a reference voltage, as in the related art technique, the value of the current flowing through a load is varied due to variations in the load of each pixel of the display panel. There is thus a risk that desired current values are unable to be promptly written in the totality of the loads.

In one aspect of the present invention, there is provided a current driving circuit comprising a first constant current source circuit that delivers a first driving current to a load, and an output voltage difference amplifier circuit that detects a voltage change produced at a load driving end during a preset time period and that delivers a current or a voltage corresponding to the voltage change to the load during a time period different from said preset time period.

The meritorious effects of the present invention are summarized as follows.

According to the present invention, the load is driven with a current or a voltage, as an auxiliary current or voltage, which is responsive to variations in the output terminal voltage. Hence, the desired driving current value can promptly be written in the load of each pixel on a display panel despite variations that may arise in the load of each pixel.

PREFERRED MODES

Figure 1:
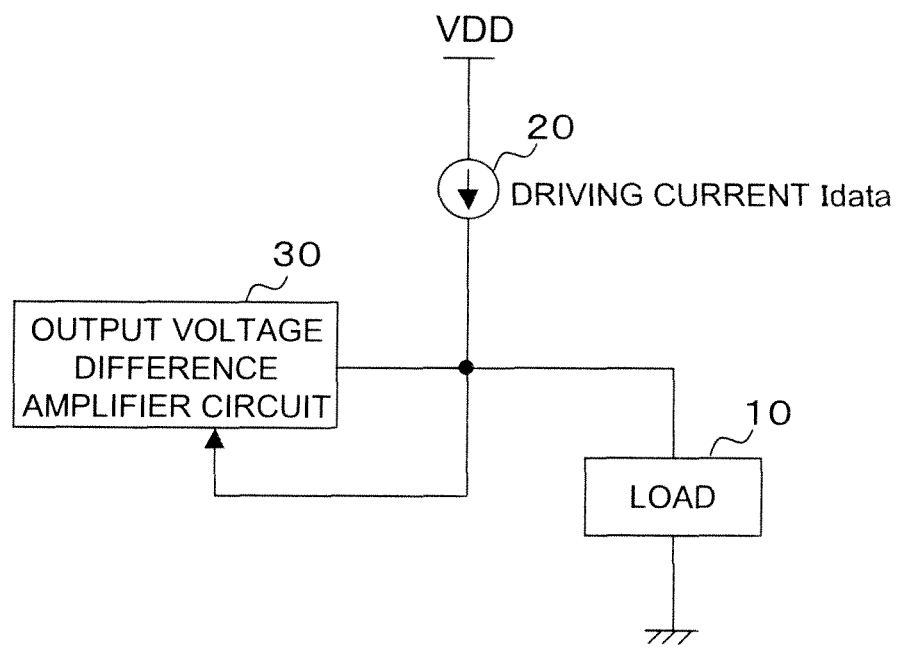
FIG. 1 is a block diagram showing the configuration of a current driving circuit according to an exemplary embodiment of the present invention.

FIG. 1 depicts a block diagram showing the configuration of a current driving circuit according to an exemplary embodiment of the present invention. Referring to FIG. 1, the current driving circuit includes a constant current source circuit 20 that delivers a driving current Idata to a load 10, and an output voltage difference amplifier circuit 30. The output voltage difference amplifier circuit 30 detects a voltage variation produced at a load driving end during a preset time period to deliver a current or a voltage corresponding to the change in the voltage to the load 10 during a time period different from the preset time period.

The output voltage difference amplifier circuit 30 may include a capacitance circuit that holds a voltage variation detected and an amplifier circuit that delivers to the load a current or a voltage generated on the basis of the change in the voltage stored.

It is possible for the output voltage difference amplifier circuit to repeat detection of the change in voltage and delivery of the current or the voltage to the load, temporally alternately.

The output voltage difference amplifier circuit may further include a first capacitance circuit, a first amplifier stage, a second capacitance circuit and a second amplifier stage. The first capacitance circuit retains a change in voltage during a first time period, and the first amplifier stage amplifies a change in voltage stored in the first capacitance circuit. The second capacitance circuit retains a change in voltage, amplified by the first amplifier stage, during a second time period following the first time period. The second amplifier stage transforms the change in voltage, amplified and stored in the second capacitance circuit, into a current during a third time period following the second time period to deliver the so generated current to the load.

Preferably, the output voltage difference amplifier circuit may include first and second MOS transistors, first, second and third capacitance elements, first and second current source circuits and first, second and third switch circuits. The first MOS transistor has a source connected to a power supply, while having a gate connected to one end of the first capacitance element, to one end of the second capacitance element whose other end is connected to a power supply, and to one end of a first switch circuit. The first MOS transistor also has a drain connected to one end of the first current source circuit, to the other end of the first switch circuit and to one end of the second switch circuit. The second MOS transistor has a source connected to the power supply, while having the gate connected to one end of the third capacitance element whose other end is connected to the power supply, and to the other end of the second switch circuit. The second MOS transistor also has a drain connected to one end of the second current source circuit and to one end of the third switch circuit. The third switch circuit has the opposite end connected to an output terminal as a load driving end of the output voltage difference simplifier circuit, and to the opposite end of the first capacitance element. Only the first and second switch circuits are turned on during a first time period, and only the second switch circuit is turned on during a second time period following the first time period. Only the third switch is tuned on during a third time period following the second time period so that a current is allowed to flow via the output terminal to the load. The first constant current circuit has one end connected to the output terminal.

The output voltage difference amplifier circuit may exercise control so that the first time period will be contiguous to the trailing end of the third time period.

During the first time period, the capacitance circuit compares the potential during a directly preceding time period to that of the current time period, and causes a potential at the load driving end to be stored in fifth and sixth capacitance elements depending on the result of comparison. The amplifier circuit buffers an average value of the potential stored in the fifth and sixth capacitance elements during the second time period following the first time period, to deliver the so buffered average value to the load.

The output voltage difference amplifier circuit includes first and second buffer circuits, fourth, fifth and sixth capacitance elements and fourth, fifth, sixth and seventh switch circuits. The first buffer circuit outputs an average value of voltages at one ends of the fifth and sixth capacitance elements via the seventh switch circuit to an output terminal as a load driving end of the output voltage difference amplifier circuit. The second buffer circuit connects the output terminal to a non-inverting input end, while connecting one end of the fourth capacitance element and one end of the sixth switch circuit to an inverting input end, and connecting the other end of the sixth switch circuit to an output end. The fourth switch circuit is connected between the output terminal and one end of the fifth capacitance element. The fifth switch circuit is connected between the output terminal and one end of the sixth capacitance element. In an initial state, a potential at one end of the fifth capacitance element is a maximum value of an operating voltage range during load driving. A potential of the sixth capacitance element is a minimum value of the operating voltage range during load driving. First and second time periods are repeated alternately. During the first time period, only the fourth switch circuit is controlled to be turned on if the potential at one end of the fourth capacitance element is higher than that of the output terminal, and only the fifth switch circuit is controlled to be turned on if the potential at one end of the fourth capacitance element is lower than that of the output terminal. Only the sixth and seventh switch circuits are controlled to be turned on during the second time period.

The current driving circuit may further comprise a second constant current circuit that enables a second driving current opposite in direction to the first driving circuit to be delivered to the load only when the load is at a preset state.

With this current driving circuit, it is possible to improve the response characteristic of current driving without lowering the accuracy of the driving current value even if the load of each pixel is subjected to variations. That is, in the load shown in FIG. 14, the closer the current flowing through the transistor MTr (MTra), the lesser are the voltage variations per unit time. Hence, the current flowing through the transistor MTr (MTra) may promptly approach a desired driving current value.

Several Examples of the present invention will now be described in detail with reference to the drawings.

EXAMPLE 1

Figure 2:
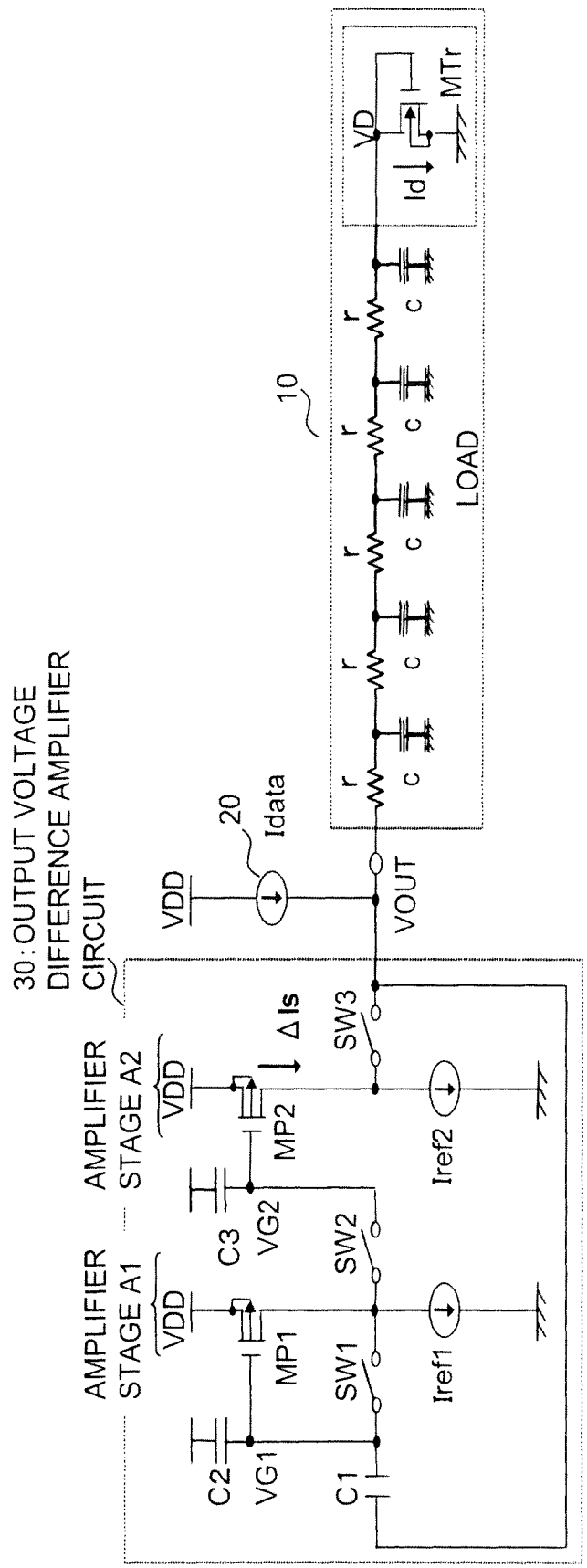
FIG. 2 is a circuit diagram of a current driving circuit according to Example 1 of the present invention.

FIG. 2 depicts a circuit diagram of a current driving circuit according to Example 1 of the present invention. Referring to FIG. 2, the current driving circuit includes a constant current source circuit 20 and an output voltage difference amplifier circuit 30. The constant current source circuit 20 is a constant current source that delivers a driving current Idata to a load 10 to drive it. The load 10 is equivalent to a panel load. In transmitting the driving current Idata to the load 10, the output voltage difference amplifier circuit 30 detects a voltage change produced at an output terminal VOUT within a certain preset time period and transforms a voltage change into a current. The output voltage difference amplifier circuit transmits a current to the load 10 during a certain preset time period different from the preset e period.

The output voltage difference amplifier circuit 30 includes Pch transistors MP1, MP2, constant current sources Iref1, Iref2, capacitance elements C1, C2 and C3 and switch circuits SW1, SW2 and SW3.

The Pch transistor MP1 has a source connected to a power supply VDD, while having a gate connected to one ends of the capacitance elements C1, C2 and to one end of the switch circuit SW1. The Pch transistor MP1 also has a drain connected to the other end of the switch circuit SW1, to one end of the switch circuit SW2 and to one end of the constant current source Iref1. The other end of the constant current source Iref1 is grounded. The Pch transistor MP1 and the constant current source Iref1 make up an amplifier stage A1.

The Pch transistor MP2 has a source connected to the power supply VDD, while having a gate connected to one end of the capacitance element C3 and to the other end of the switch circuit SW2. The Pch transistor MP2 also has a drain connected to one end of the switch circuit SW3 and to one end of the constant current source Iref2 whose opposite end is grounded. The Pch transistor MP2 and the constant current source Iref2 make up an amplifier stage A2.

The other end of the switch circuit SW3 is connected to an output terminal VOUT, one end of the constant current source circuit 20 whose opposite end is connected to the power supply VDD, a load 10, and to the other end of the capacitance element C1.

The other ends of the capacitance elements C2, C3 are connected to the power supply VDD.

With the output voltage difference amplifier circuit 30, set forth above, changes in voltage at the output terminal VOUT are transformed into amplified current values by the two amplifier stages A1 and A2.

Figure 3:
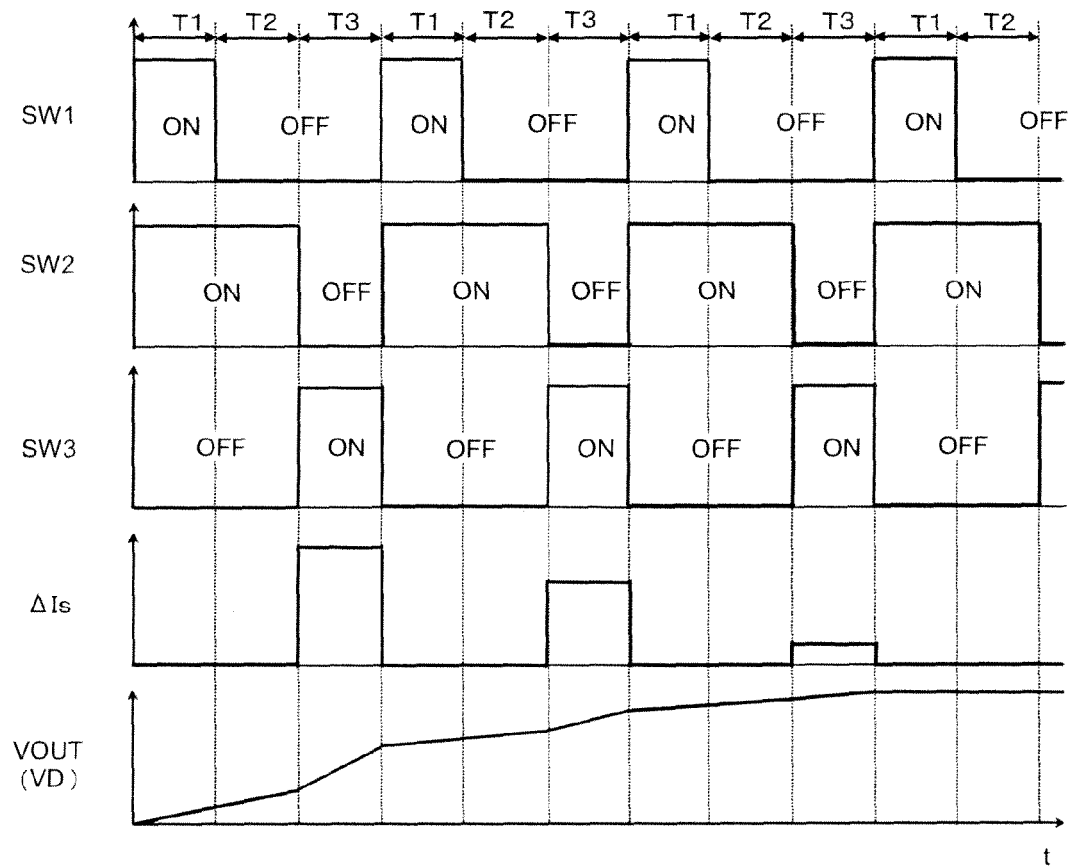
FIG. 3 is a timing chart of the current driving circuit according to Example 1 of the present invention.

FIG. 3 depicts a timing chart of a current driving circuit according to Example 1 of the present invention. In a time interval T1 of FIG. 3, the switch circuits SW1, SW2 are turned ON, while the switch circuit SW3 is turned OFF. Thus, the currents of the same value as that of the currents flowing through the constant current sources Iref1, Iref2 flow through the Pch transistors MP1, MP2, respectively. In this state, the voltage values of a gate voltage VG1 of the Pch transistor MP1 and a gate voltage VG2 of the Pch transistor MP2 are stabilized. During the time interval T1, the switch circuit SW3 is OFF, so that only the driving current Idata flows through the load 10. During a time interval T2, the switch circuits SW1, SW3 are OFF, and the switch circuit SW2 is ON. Hence, a voltage variation $\Delta$VOUT at the output terminal VOUT during the time interval T2 is a voltage change $\Delta$VG1 of the gate voltage VG1. This voltage change $\Delta$VG1 is amplified to a voltage change $\Delta$VG2 of the gate voltage VG2 by the amplifier stage A1 made up of the Pch transistor MP1 and the constant current source Iref1. The relationship between the voltage variation $\Delta$VOUT and the voltage change $\Delta$VG1 is given by an equation:

$$\Delta VG1 = C1 \times \Delta VOUT/(C1+C2)$$

The voltage change $\Delta$VG2 is amplified by the amplifier stage A2 made up of the Pch transistors MP2 and the constant current source Iref2.

During a time interval T3, the switch circuits SW1, SW2 are OFF, while the switch circuit SW3 is ON. Hence, a current $\Delta$Is, transformed from the voltage change $\Delta$VG2 and amplified by the amplifier stage A2, is delivered via the output terminal VOUT to the load 10. If the potential variation of the output terminal VOUT during the time interval T2 is positive (+), $\Delta$VG1>0 and $\Delta$VG2<0, so that a current $\Delta$Is flows from the Pch transistor MP2 via the output terminal VOUT to the load 10. If conversely the potential variation of the output terminal VOUT during the time interval T2 is negative (−), then $\Delta$VG1<0 and $\Delta$VG2>0. Hence, the current driving capability of the Pch transistor MP2 will decrease so that the current $\Delta$Is flows from the load 10 via the output terminal VOUT to the constant current source Iref2.

The current driving circuit of FIG. 2 repeats the operations that occur during the time intervals T1 to T3 shown in FIG. 3 in order to generate the current $\Delta$Is, obtained on transforming the voltage variation $\Delta$VOUT into the current and amplifying the resulting signal, and in order to repeatedly deliver the current along with the driving current Idata to the load 10. If only the driving current Idata is delivered to the load 10, only the driving current Idata is delivered from the constant current source circuit 20 to the load 10 without regard to how the voltage at the output terminal VOUT is changed. In the presence of the output voltage difference amplifier circuit 30, the current Ms is delivered, in addition to the driving current Idata, to the load in case the current has not been sufficiently charged to the load 10, likewise when the voltage at the output terminal VOUT has increased. In case the current has been delivered to the load 10 in excess, likewise when the voltage at the output terminal VOUT has decreased, the current corresponding to the driving current Idata less the current $\Delta$Is is delivered to the load 10. Since the larger the voltage variation $\Delta$VOUT, the larger is the current Ms, and the smaller the voltage variation $\Delta$VOUT, the smaller is the current $\Delta$Is, it is possible to promptly write the driving current Idata in the current memorizing (retention) transistor MTr in the load 10 (Id=Idata).

EXAMPLE 2

Figure 4:
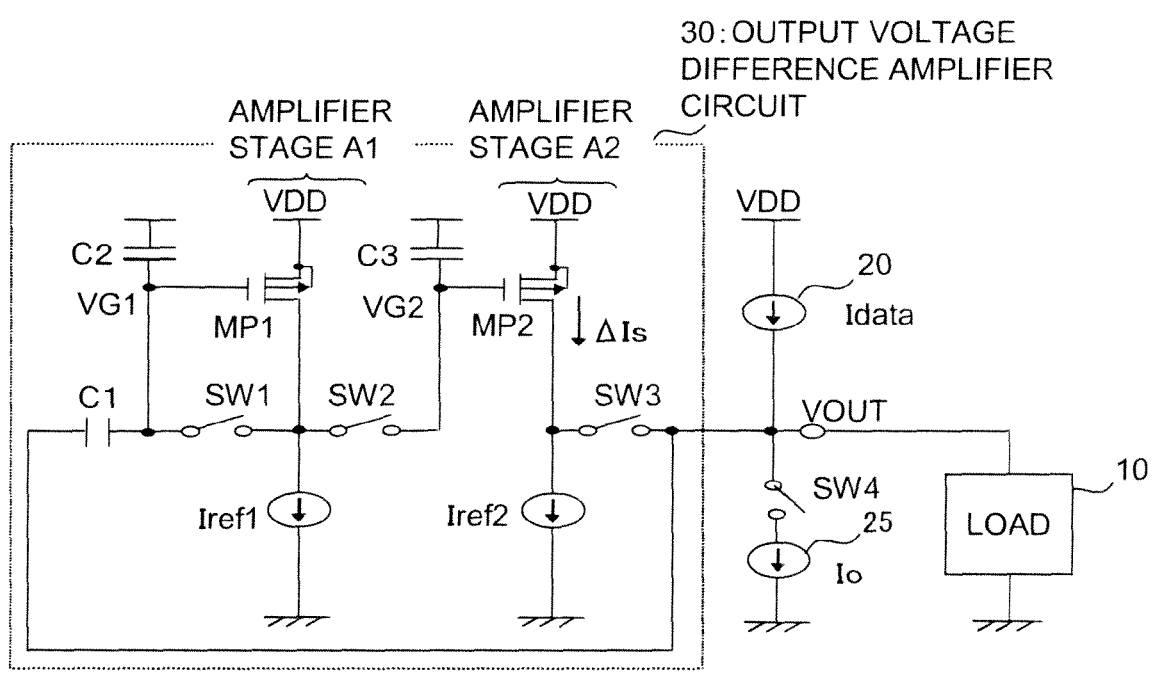
FIG. 4 is a circuit diagram of a current driving circuit according to Example 2 of the present invention.

FIG. 4 depicts a circuit diagram of a current driving circuit according to Example 2 of the present invention. In FIG. 4, the reference numerals which are the same as those of FIG. 2 depict the same objects and the corresponding description is dispensed with. The current driving circuit of FIG. 4 includes, in addition to circuit components of FIG. 2, a series circuit of a constant current source circuit 25 and a switch circuit SW4. The constant current source circuit 25 generates a driving current Io for a zero gray level (Id=0).

In Example 1, in order for the constant current source circuit 20 to drive the load 10 to zero current, there is no alternative but to wait for the close of natural discharge of electrical charges accumulated in the load 10. However, the smaller the current Id, the longer becomes the discharge time. Thus, to promptly set Id so as to be equal to 0 (Id=0), it is necessary to sink the current from the current driving circuit. To this end, with the current driving circuit of FIG. 4, the constant current source circuit 25 for 0 gray level (Id=0) is provided, and the switch circuit SW4 is turned ON only for the case of Id=0 (zero gray level) to sink the current Io from the output terminal VOUT. It is thus possible to promptly write a current value closer to zero in the current memorizing transistor MTr.

Meanwhile, for the 0-gray level, the drain voltage VD of the transistor MTr is lowered due to the driving current Io. However, if the driving current Idata can be promptly written in the transistor MTr, as in the present invention, there is raised no problem even if a drain voltage VD is lower than the threshold voltage of the transistor MTr.

EXAMPLE 3

Figure 5:
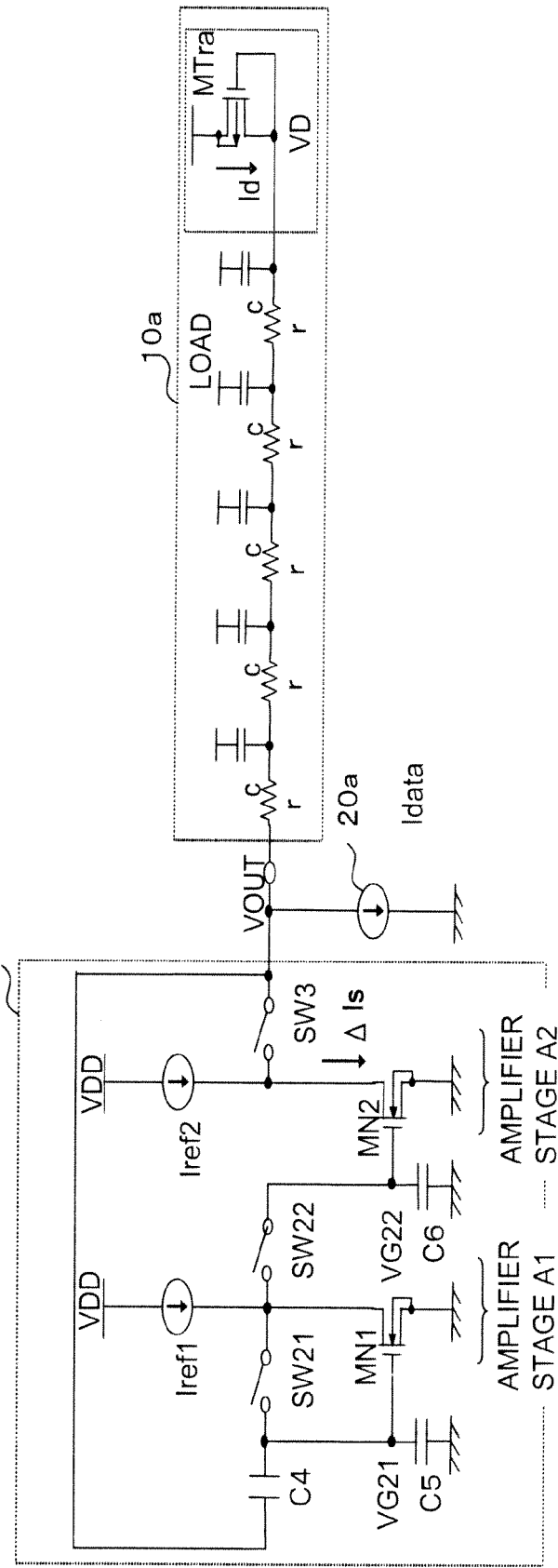
FIG. 5 is a circuit diagram of a current driving circuit according to Example 3 of the present invention.

FIG. 5 depicts a circuit diagram of a current driving circuit according to Example 3 of the present invention. In the current driving circuit of FIG. 5, a current retention transistor MTra in a load 10a, is a Pch MOS transistor as shown in FIG. 14B, and a constant current source circuit 20a is of a current sink (or pull down) type.

An output voltage difference amplifier circuit 30a is similar in configuration to the output voltage difference amplifier circuit 30 except that the polarities of the entire circuit components of the circuit 30a are reversed. That is, the power supply and the ground are interchanged, and the Pch transistors MP1, MP2 are replaced by Nch transistors MN1, MN2, respectively. In addition, the capacitance elements C1, C2 and C3 are replaced by capacitance elements C4, C5 and C6, respectively, and the switch circuits SW1, SW2 are replaced by switch circuits SW21, SW22, respectively.

The operating principle of the current driving circuit, set forth above, is similar to that of FIG. 2. That is, the larger the voltage variation ΔVOUT at the output terminal VOUT, the larger is the current Ms, and the smaller the voltage variation ΔVOUT, the smaller is the current Ms. It is thus possible to promptly write the driving current Idata in the current memorizing transistor MTra (Id=Idata).

EXAMPLE 4

Figure 6:
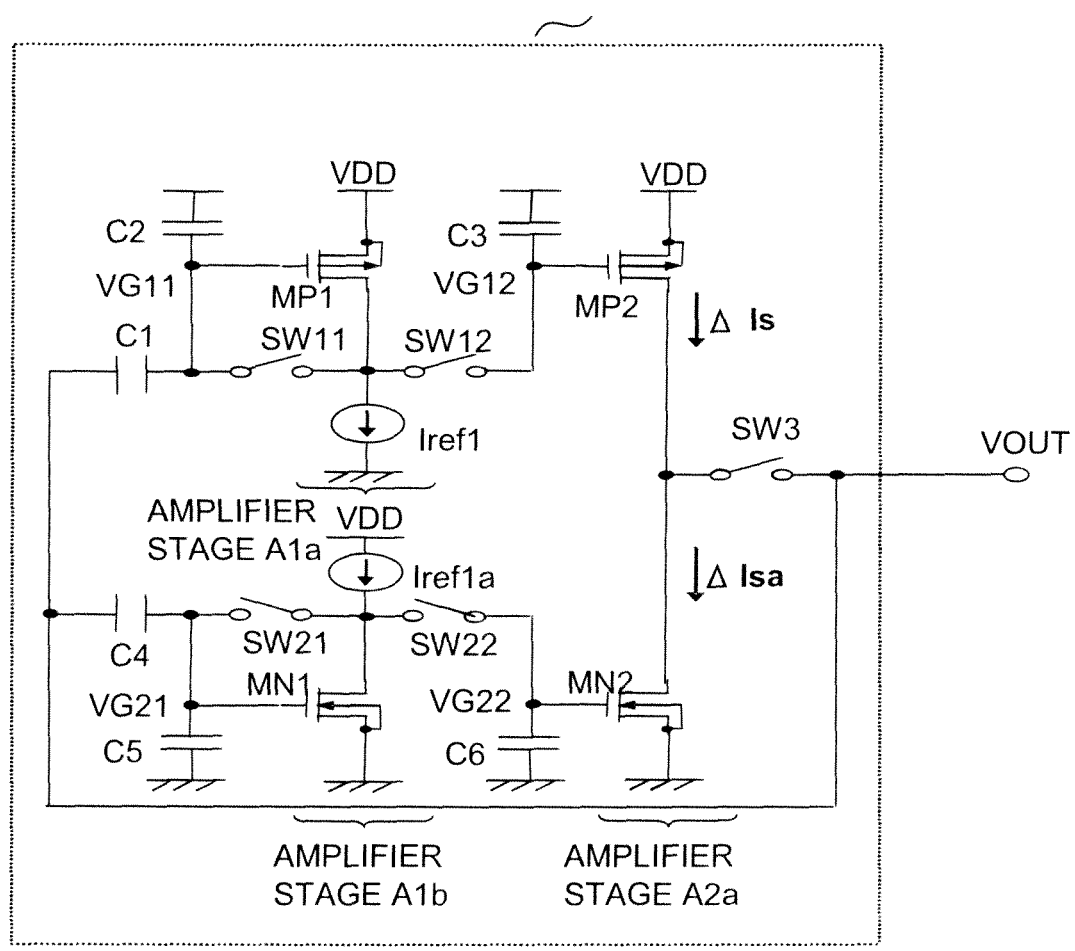
FIG. 6 is a circuit diagram of a current driving circuit according to Example 4 of the present invention.

FIG. 6 depicts a circuit diagram of a current driving circuit according to Example 4 of the present invention. In FIG. 6, the reference numerals which are the same as those of FIGS. 2 and 5 denote the same objects and the corresponding description is dispensed with. However, the constant current source Iref1 in FIG. 5 is indicated in FIG. 6 as a constant current source Iref1a. With an output voltage difference amplifier circuit 30b of FIG. 6, the drains of the Pch transistor MP2 and the Nch transistor MN2 are connected common and connected via a switch circuit SW3 to the output terminal VOUT. The Pch transistor MP1 and the constant current source Iref1 make up an amplifier stage A1a, and the Nch transistor MN1 and the constant current source Iref1 a make up an amplifier stage A1b. The Pch transistor MP2 and the Nch transistor MN2 make up an amplifier stage A2a.

Figure 14A:
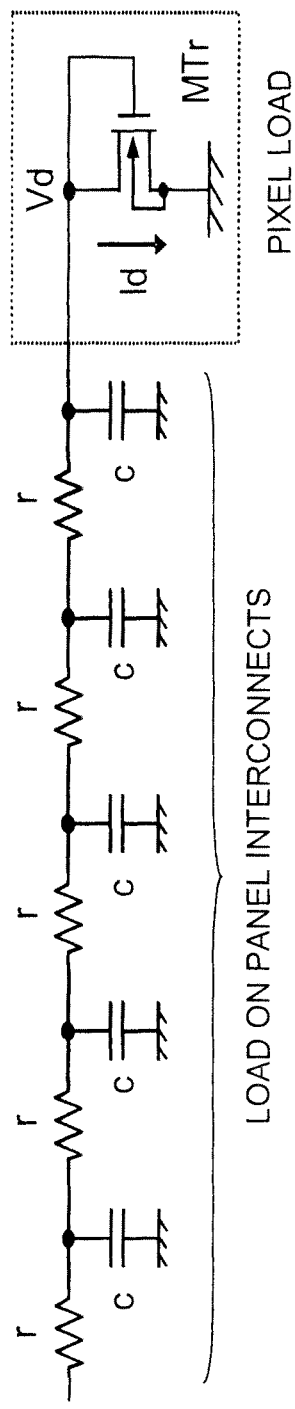
FIGS. 14A and 14B are equivalent circuits of a load corresponding to an organic EL elements, etc.
Figure 14B:
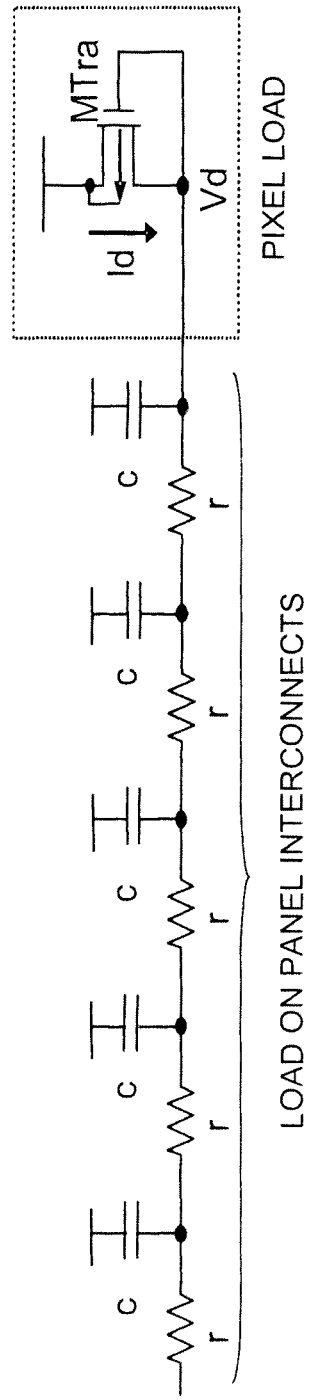

The output voltage difference amplifier circuit 30b, as set forth above, is able to cope with either of loads shown in FIGS. 14A and 14B. It is observed that, in FIG. 6, the constant current source circuits 20, 20a for driving the loads shown in FIGS. 14A, 14B are not shown for simplicity.

Figure 7:
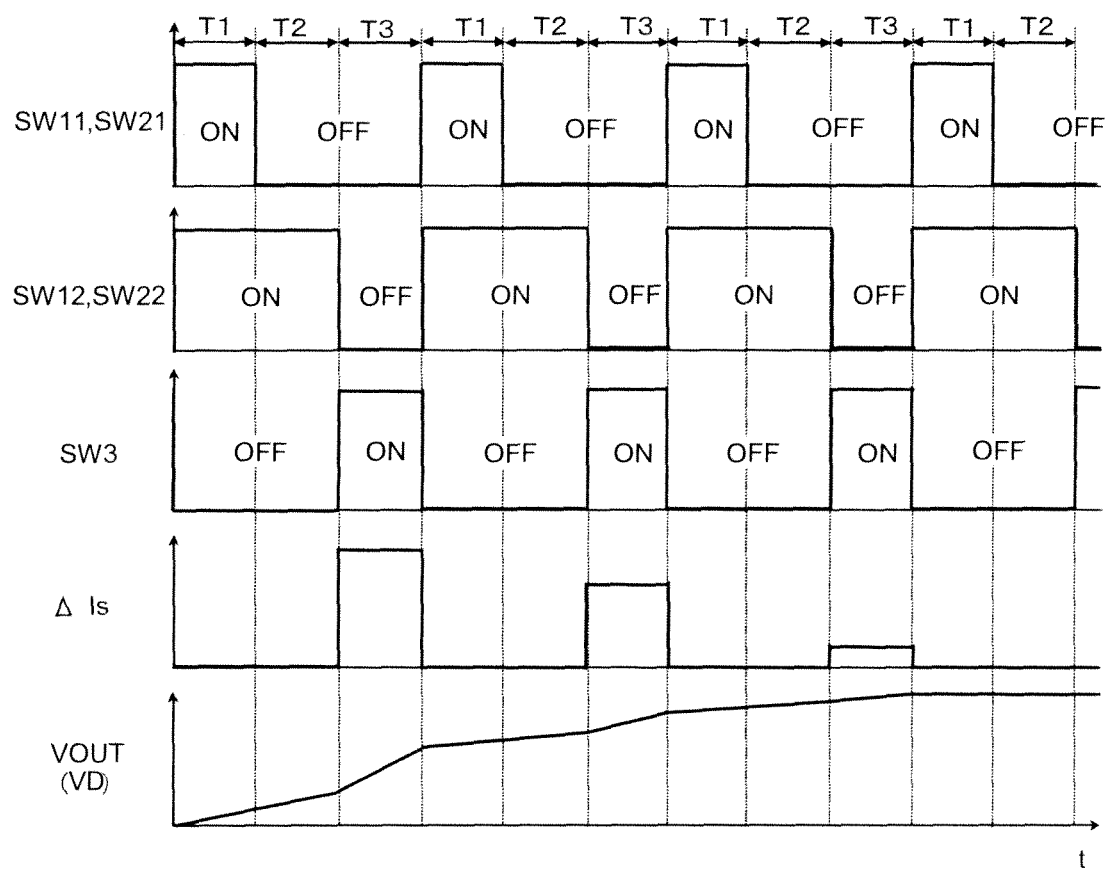
FIG. 7 is a timing chart of the current driving circuit according to Example 4 of the present invention.

FIG. 7 depicts a timing chart showing a current driving circuit according to Example 4 of the present invention.

In a time interval T1, switch circuits SW11, SW21, SW12 and SW22 are turned ON and the switch circuit SW3 is turned OFF. Thus, the current of the same current value as that flowing through the constant current source Iref1 flows through the Pch transistor MP1, while the current of the same current value as that flowing through the constant current source Iref1 a flows through the Nch transistor MN1. In this state, the voltage values of the gate voltages VG11, VG21, VG12 and VG22 are stabilized. It is observed that the Pch transistors MP1, MP2 are of the same size and the Nch transistors MN1, MN2 are of the same size. Since the switch circuit SW3 is OFF at this time, no current flows from the output voltage difference amplifier circuit 30b to the load.

During a time interval T2, the switch circuits SW11. SW21 and SW3 are turned OFF and the switch circuits SW12, SW22 are turned ON. Thus, during the time interval T2, a voltage variation at the output terminal VOUT is ΔVOUT, the voltage variation of the gate voltage VG11 is ΔVG11 and the voltage variation of the gate voltage VG21 is ΔVG21. This voltage variation ΔVG21 is amplified to a voltage variation ΔVG22 of the gate voltage VG22 by the amplifier stage A1b made up of the Nch transistor MN1 and the constant current source Iref1a. The voltage variation ΔVG11 of the gate voltage VG11 is amplified to a voltage variation ΔVG12 of the gate voltage VG12 by the amplifier stage A1a made up of the Pch transistor MP1 and the constant current source Iref1. The relationship between ΔVOUT and ΔVG11, ΔVG21 is given by $$\Delta VG11 = C1 \times \Delta VOUT/(C1+C2)$$

$$\Delta VG21 = C4 \times \Delta VOUT/(C4+C5)$$

ΔVG12, ΔVG22 are amplified by the amplifier stage A2a made up of the Pch transistor MP2 and the Nch transistor MN2. During the time interval T3, the switch circuits SW11, SW21, SW12 and SW22 are OFF, while the switch circuit SW3 is ON. Thus, currents ΔIs and ΔIsa, respectively amplified by ΔVG12, ΔVG2 by the amplifier stage A2a, flow through the load via the output terminal VOUT. Thus, if the potential variation at the output terminal VOUT during the time interval T2 is positive (+), ΔVG11>0, ΔVG21>0, ΔVG12<0 and ΔVG22<0, and hence the current ΔIs flows from the Pch transistor MP2 via output terminal VOUT to the load. If the potential variation at the output terminal VOUT during the time interval T2 is negative (−), ΔVG11<0, ΔVG21<0, ΔVG12>0 and ΔVG22>0. Hence the current ΔIsa flows from the load via the output terminal VOUT to the Nch transistor MN2.

EXAMPLE 5

Figure 8:
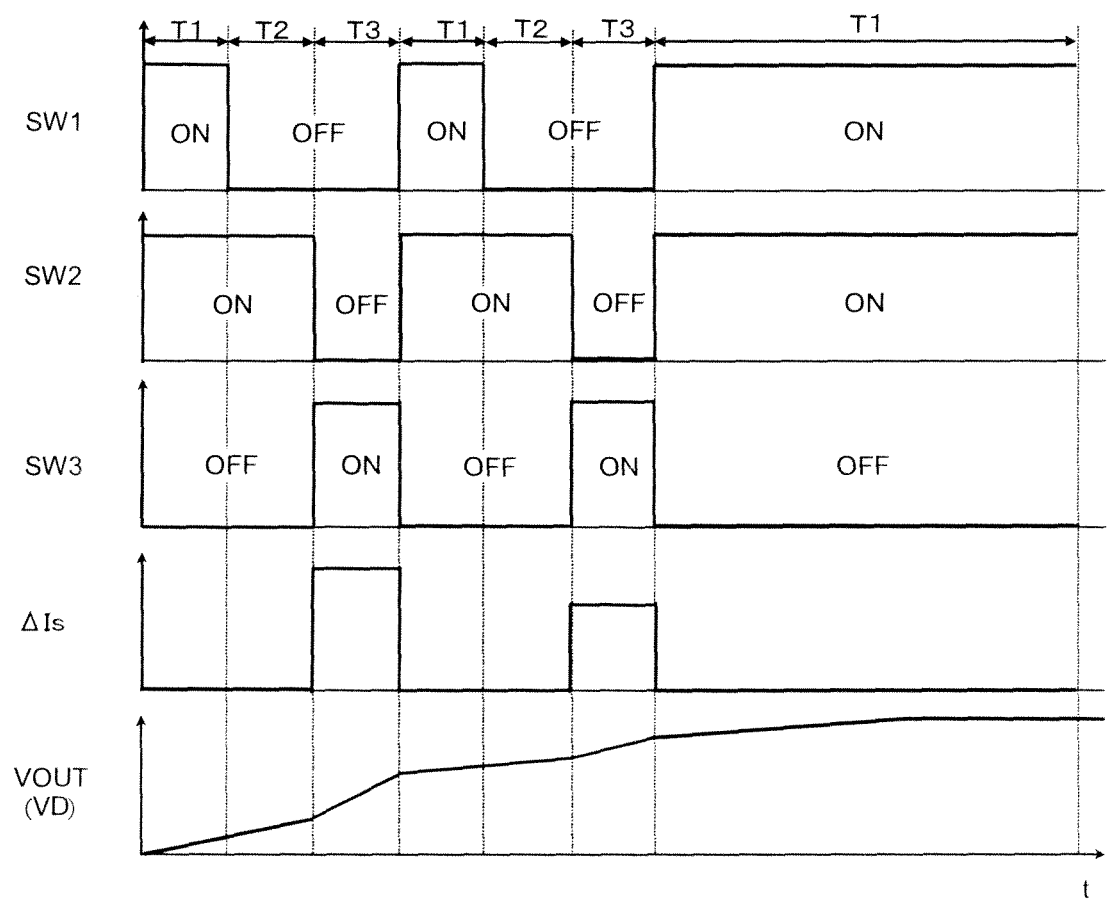
FIG. 8 is a timing chart of the current driving circuit according to Example 5 of the present invention.

FIG. 8 depicts a timing chart of a current driving circuit according to Example 5 of the present invention. The current driving circuit of FIG. 2 repeats the operations that occur during the time intervals T1 to T3 shown in FIG. 8 in order to generate the current ΔIs, transformed from the voltage variation ΔVOUT and amplified, and in order to repeatedly deliver the current along with the driving current Idata to the load 10. If, by so doing, a sizeable amount of the driving current Idata has been written in the transistor MTr, the state of the time interval T1 may be set for the time being to write only the driving current Idata by way of carrying out current writing. This operation is performed to compensate for the driving current value since there is a possibility that a minor amount of current ΔIs may flow to the load due to manufacture tolerances of the output voltage difference amplifier circuit even in case there is no voltage variation at the output terminal VOUT.

Figure 9:
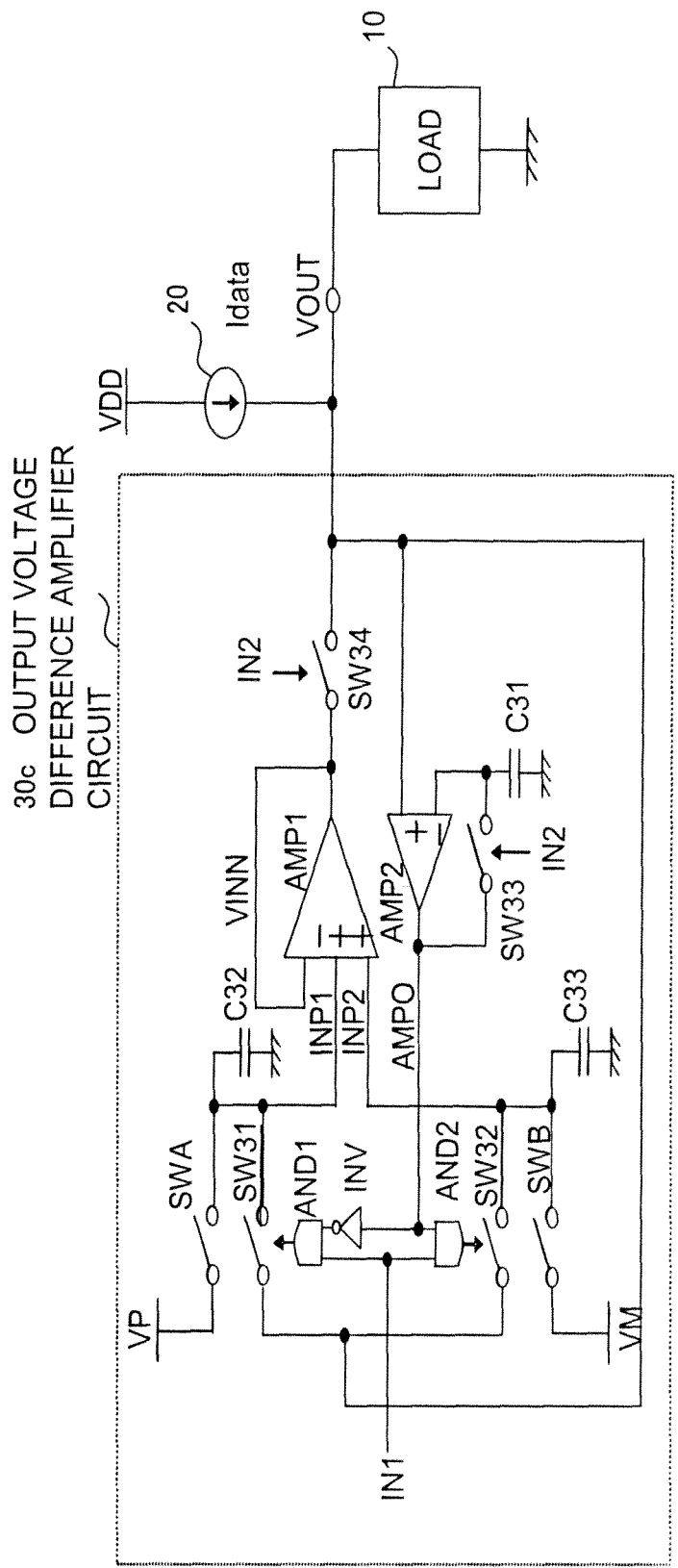
FIG. 9 is a circuit diagram of a current driving circuit according to Example 6 of the present invention.

FIG. 9 depicts a circuit diagram of a current driving circuit according to Example 6 of the present invention. The current driving circuit according to Example 6 differs from the Examples 1 to 5 in that an output voltage difference amplifier circuit 30c amplifies an output difference voltage and the so amplified voltage value is output to an output terminal VOUT. The constant current source circuit 20 and the load are the same as those shown in FIG. 2.

Referring to FIG. 9, the output voltage difference amplifier circuit 30c includes amplifier circuits AMP1, AMP2, two-input AND circuits AND1, AND2, an inverter circuit INV, capacitance elements C31 to C33, and switch circuits SWA, SWB and SW31 to SW34.

The amplifier circuit AMP1 has its inverting (−) input terminal connected to its output terminal to output an average value of two voltages applied to its two non-inverting input terminals (+) at its output terminal. One of the two non-inverting input terminals, supplied with a voltage INP1, is connected to one end of the switch circuit SWA, one end of the switch circuit SW31 and to one end of the capacitance element C32 whose other end is grounded. The other end of the switch circuit SWA is supplied with a voltage VP. The other non-inverting input terminal, supplied with a voltage INP2, is connected to one end of the switch circuit SWB, one end of the switch circuit SW32 and to one end of the capacitance element C33, the other end of which is grounded. The other end of the switch circuit SWB is supplied with a voltage VM. An output terminal of the amplifier circuit AMP1 is connected to the output terminal VOUT via the switch circuit SW34 adapted to be opened or closed under control by a signal 12. The voltages VM, VP are respectively set to the minimum and maximum values within the operating voltage range during load driving.

The amplifier circuit AMP2 has its non-inverting (+) input terminal connected to the output terminal VOUT, while having its inverting input terminal (−) to one end of the capacitance element C31, the other end of which is grounded, and to one end of the switch circuit SW33. The switch SW33 is adapted to be opened or closed under control by the signal IN2. The amplifier circuit AMP2 also has its output terminal connected to the other end of the switch circuit SW33 and to one input end of the AND circuit AND2. The output terminal of the amplifier circuit AMP2 is also connected via the inverter circuit INV to one input end of the AND circuit AND1.

A signal IN1 is delivered to the outer input end of the AND circuit AND1, an output end signal of which controls the switch circuit SW31 to be on or off.

The signal IN1 is delivered to the other input end of the AND circuit AND2, an output end signal of which controls the switch circuit SW32 to be on or off.

The other ends of the switch circuits SW31, SW32 are connected to an output terminal VOUT.

Figure 10:
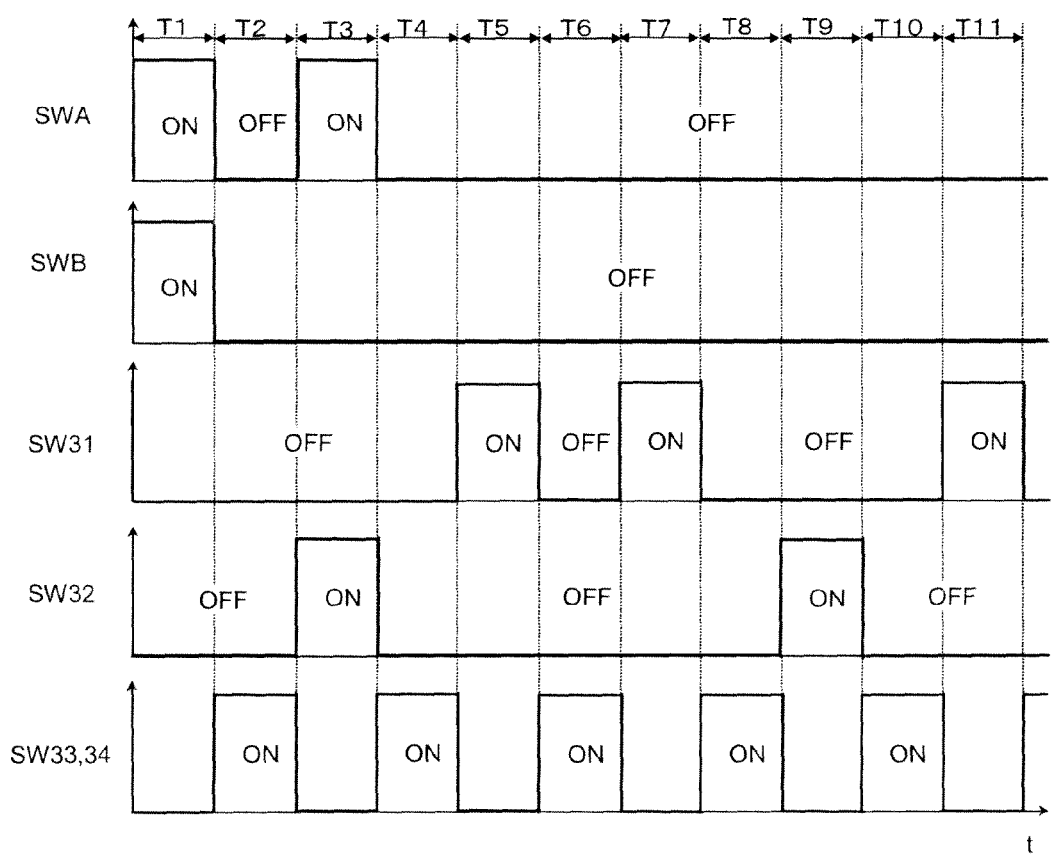
FIG. 10 is a timing chart of the current driving circuit according to Example 6 of the present invention.

The operation of the output voltage difference amplifier circuit 30c is now described. FIG. 10 depicts a timing chart of a current driving circuit according to Example 6 of the present invention. Meanwhile, the driving current Idata keeps on flowing as from the time interval T1 during the load driving.

During the time interval T1, only the switch circuits SWA, SWB are turned ON, so that, at the amplifier circuit AMP1, INP1=VP and INP2=VM. The amplifier circuit AMP1 operates so that the output voltage VINN=(VINP1+VINP2)/2.

Figure 11:
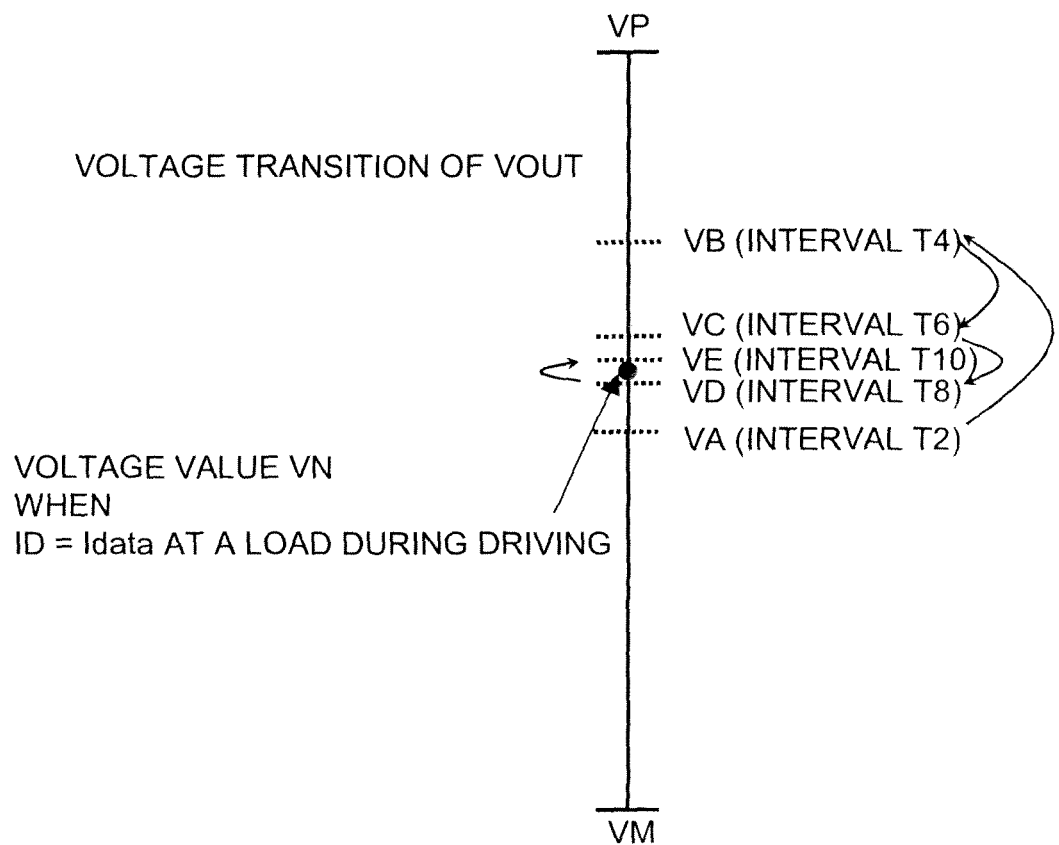
FIG. 11 is a diagram showing transitions of an output voltage of the current driving circuit according to Example 6 of the present invention.
Figure 12:
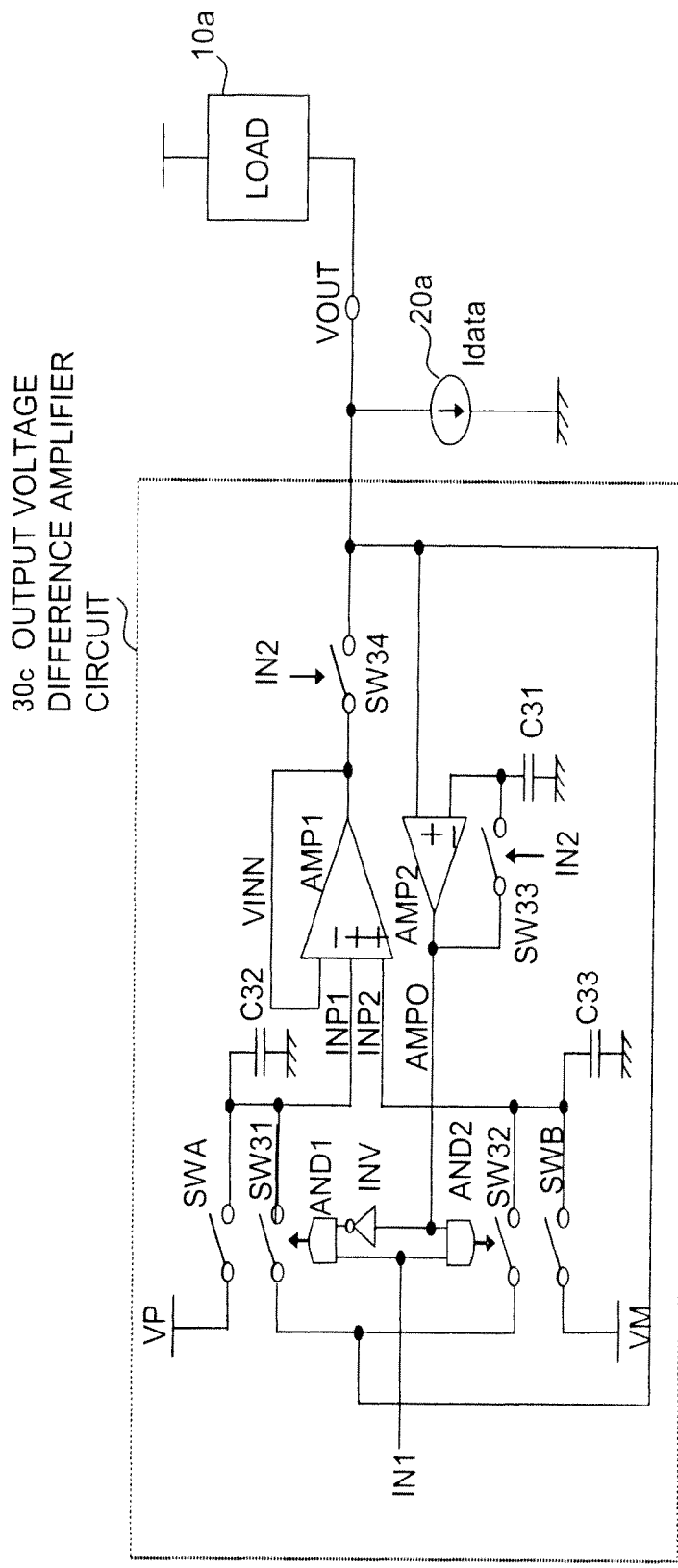
FIG. 12 is a circuit diagram of another current driving circuit according to Example 6 of the present invention.
Figure 13:
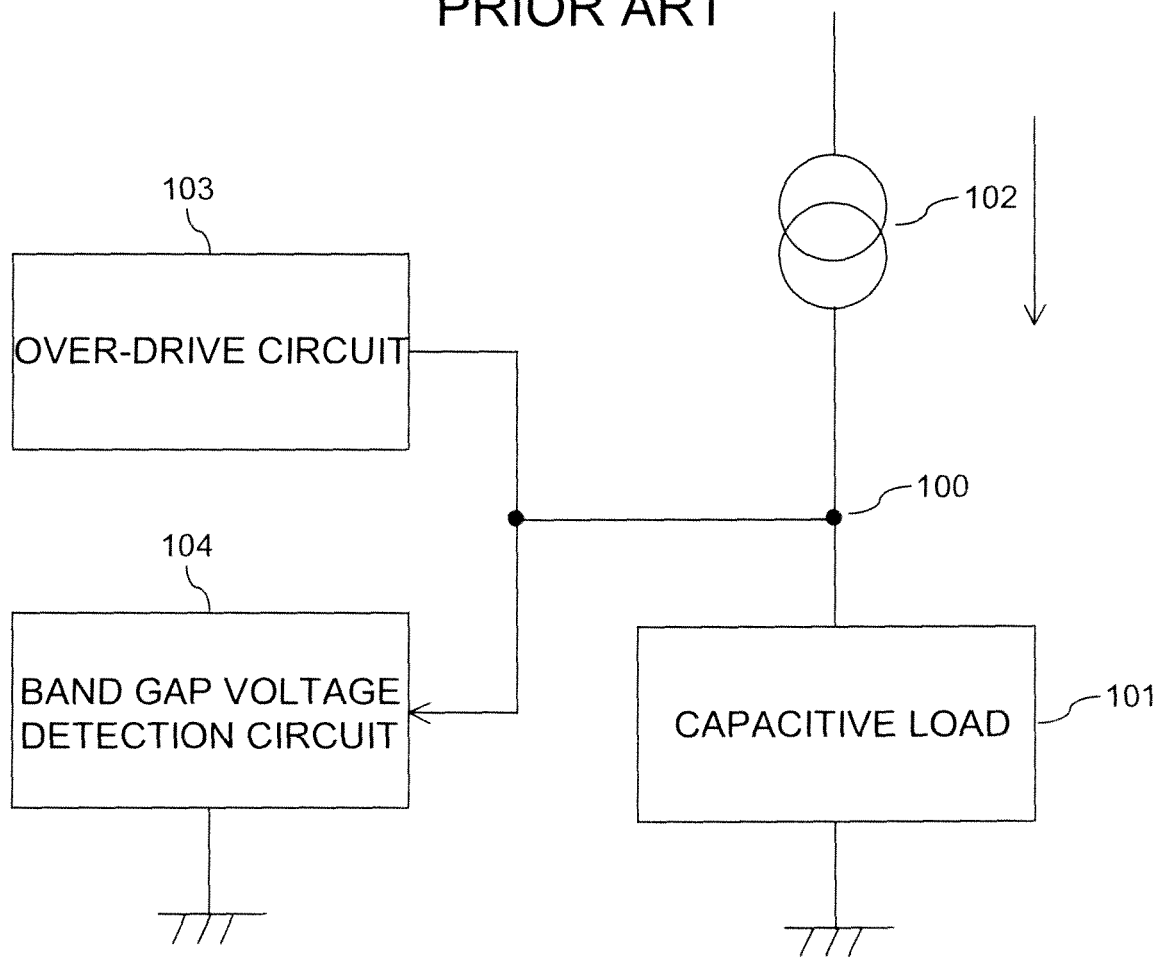
FIG. 13 is a block diagram of a current driving circuit disclosed in Patent Document 1.

During the time interval T2, the switch circuits SWA, SWB are turned OFF and, by the signal IN2, the switch circuits SW33, SW34 are turned ON. At this time, the switch circuits SWA, SWB are OFF. However, INP1=VP and INP2=VM are kept by the capacitance elements C32, C33. Hence, the output terminal VOUT is driven to the voltage VINN=(VP+VM)/2. If the voltage at this time is VA, VOUT=VA holds during the time interval T2, as shown in FIG. 11. Since the switch circuit SW33 is ON, the amplifier circuit AMP2 operates as a buffer, and an output voltage AMPO of the amplifier circuit AMP2 is such that AMPO=VA.

Next, during the time interval T3, the switch circuits SW33, SW34 are turned OFF by the signal IN2. The signal IN1 is set to H level. The voltage VA is retained by the capacitance element C31. At this time, solely the driving current Idata flows from the output terminal VOUT to the load. The charging/discharging of the load will ultimately come to a close by the driving current Idata. If the voltage VD when the current Id flowing through the transistor MTr of the display panel pixel is equal to Idata (Id=Idata) is larger than VA (VD>VA), then VOUT>VA. Since the switch circuit SW33 is OFF at this time, the amplifier circuit AMP2 operates as a comparator so that AMPO is at H level. Hence, the AND circuit AND2 is activated to turn on the switch circuit SW32. At this time, the switch circuit SWB is turned OFF. In the amplifier circuit AMP1, INP1=VP and INP2=VA, more precisely, INP2 is at intermediate between VD and VA, and VINN=(VP+VA)/2.

During the time interval T4, the switch circuits SW33, SW34 are turned ON by the signal IN2. At this time, the switch circuits SWA, SWB are OFF. However, INP1=VP and INP2=VA are maintained by the capacitance elements C32 and C33, respectively. Hence, the output terminal VOUT is driven to a voltage VINN=(VP+VA)/2. If the voltage at this time is VB, VOUT=VB during the time interval T4, as shown in FIG. 11. Since the switch circuit SW33 is ON, the amplifier circuit AMP2 operates as a buffer, such that the output voltage AMPO of the amplifier circuit AMP2 is equal to VB (AMPO=VB).

Next, during the time interval T5, the switch circuits SW33 and SW34 are turned OFF by the signal IN2. The signal IN1 is set to H level. The voltage VB is retained at the capacitance element C31. At this time, solely the driving current Idata flows from the output terminal VOUT to the load. The charging/discharging of the load ultimately comes to the close (completes) by the driving current Idata. If the voltage VD when the current Id flowing through the transistor MTr of the display panel pixel is equal to Tdata (Id=Idata) is smaller than VB (VD<VB), then VOUT<VB. Since the switch circuit SW33 is OFF at this time, the amplifier circuit AMP2 operates as a comparator so that AMPO is at L level. Hence, the AND circuit AND1 is activated to turn the switch circuit SW31 ON. At this time, the switch circuit SWA is turned OFF. In the amplifier circuit AMP1, INP1=VB and INP2=VA, and VINN=(VB+VA)/2 holds.

During the time interval T6, the switch circuits SW33, SW34 are turned ON by the signal IN2. At this time, the switch circuits SWA, SWB are OFF. However, INP1=VB and INP2=VA are maintained by the capacitance elements C32 and C33. Hence, the output terminal VOUT is driven to a voltage VINN=(VB+VA)/2. If the voltage at this time is VC, VOUT=VC during the time interval T6, as shown in FIG. 11. Since the switch circuit SW33 is ON, the amplifier circuit AMP2 operates as a buffer, such that the output voltage AMPO of the amplifier circuit AMP2 is equal to VC (AMPO=VC).

Similarly, VOUT=VD=(VC+VA)/2 and VOUT=VE=(VC+VD)/2 during the time intervals T8 and T10, respectively, as shown in FIG. 11.

By repeating the above operation for the time intervals Tk and Tk+1, k being an even number, high-speed driving towards VOUT=VN, where VN denotes a voltage value when Id=Idata at the load, may be achieved. Meanwhile, the output voltage difference amplifier circuit 30c is to be of such a configuration in which the switch circuits SWA, SWB are turned ON during the time interval T1 and, if once the switch circuits SW31 and SW32 are turned ON, the switch circuits SWA, SWB are set to OFF for all time.

The output voltage difference amplifier circuit 30c drives the load 10 as it switches from the current driving by the constant current source circuit 20 for the time intervals T1, T3, T5, T7, T9, T11 and so forth to the voltage driving for the time intervals T2, T4, T6, T8, T10 and so forth, and vice versa. In the voltage driving during the time intervals T2, T4, T6, T8, T10 and so forth, the operating point of the load driving is shifted as with binary search so as to converge at the operating point in a short time, as shown in FIG. 11. For example, if VP=10V and VM=0V, binary search is carried out ten times, whereby the operating point may be converged at a precision corresponding to division of the voltage interval by 2 raised to the power of ten ($10^2$), that is, at a precision of (10V−0V)/1024≈9.8 mV, as shown in FIG. 9. If the converging time is set to 0.5 μs per interval, converging may be completed within the driving time of 10 μs.

It is observed that, by using the constant current source circuit 20a, shown in FIG. 5, in place of the constant current source circuit 20, it is possible to accommodate the operation of the driving current adapted to cope with a load of FIG. 14B.

The disclosures of the aforementioned Patent Documents are incorporated herein by reference thereto. The particular exemplary embodiments or examples may be modified or adjusted within the gamut of the entire disclosure of the present invention, inclusive of claims, based on the fundamental technical concept of the invention. Further, variegated combinations or selections of the elements disclosed herein may be made within the scope of the claims. That is, the present invention may encompass various modifications or corrections that may occur to those skilled in the art within the gamut of the entire disclosure of the present invention, inclusive of claim and the technical concept of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A current driving circuit, comprising:
   a first constant current source circuit that delivers a first driving current to a load; and
   an output voltage difference amplifier circuit that detects a voltage change produced at a load driving end during a preset time period and that delivers a current or a voltage corresponding to said voltage change to said load during a time period different from said preset time period,
   wherein, during a first time period, a capacitance circuit compares the potential during a directly preceding time period to that during the current time period, and causes a potential at the load driving end during the current time period to be stored in any of fifth and sixth capacitance elements depending on a result of comparison, and
   wherein said output voltage difference amplifier circuit buffers an average value of the potential values stored in said fifth and sixth capacitance elements during a second time period following said first time period, followed by delivering said average value to said load.

2. The current driving circuit according to claim 1, wherein said output voltage difference amplifier circuit repeats detection of said voltage change and delivery of said current or voltage to said load temporally alternately.

3. The current driving circuit according to claim 1 further comprising:
   a second constant current circuit that enables a second driving current opposite in direction to said first driving circuit to be delivered to said load only when said load is at a preset state.

4. A current driving circuit, comprising:
   a first constant current source circuit that delivers a first driving current to a load; and
   an output voltage difference amplifier circuit that detects a voltage change produced at a load driving end during a preset time period and that delivers a current or a voltage corresponding to said voltage change to said load during a time period different from said preset time period,
   wherein, said output voltage difference amplifier circuit includes first and second buffer circuits, fourth, fifth and sixth capacitance elements and fourth, fifth, sixth and seventh switch circuits,
      said first buffer circuit outputting an average value of voltages at one ends of said fifth and sixth capacitance elements via said seventh switch circuit to an output terminal as a load driving end of said output voltage difference amplifier circuit,
      said second buffer circuit connecting said output terminal to a non-inverting input end, connecting one end of said fourth capacitance elements and one end of said sixth switch circuit to an inverting input end, and connecting the other end of said sixth switch circuit to an output end,
      said fourth switch circuit being connected between said output terminal and one end of said fifth capacitance element,
      said fifth switch circuit being connected between said output terminal and one end of said sixth capacitance element,
   wherein an initial state, a potential at one end of said fifth capacitance element is a maximum value of an operating voltage range during load driving,
      a potential of said sixth capacitance element being a minimum value of said operating voltage range during load driving, and
   wherein first and second time periods are repeated alternately,
      only said fourth switch circuit being controlled to be turned on if the potential at one end of said fourth capacitance element is higher than that of said output terminal, and only said fifth switch circuit being controlled to be turned on if the potential at one end of said fourth capacitance element is lower than that of said output terminal, during said first time period, and
      only said sixth and seventh switch circuits are controlled to be turned on during said second time period.

5. The current driving circuit according to claim 4, wherein said output voltage difference amplifier circuit repeats detection of said voltage change and delivery of said current or voltage to said load temporally alternately.

6. The current driving circuit according to claim 4, further comprising:
   a second constant current circuit that enables a second driving current opposite in direction to said first driving circuit to be delivered to said load only when said load is at a preset state.

7. A method of current driving circuit, comprising:
  delivering, by a first constant current source circuit, a first driving current to a load; and
  detecting, by an output voltage difference amplifier circuit, a voltage change produced at a load driving end during a preset time period and that delivers a current or a voltage corresponding to said voltage change to said load during a time period different from said preset time period,
    wherein, during a first time period, a capacitance circuit compares the potential during a directly preceding time period to that during the current time period, and causes a potential at the load driving end during the current time period to be stored in any of fifth and sixth capacitance elements depending on a result of comparison, and
    wherein said output voltage difference amplifier circuit buffers an average value of the potential values stored in said fifth and sixth capacitance elements during a second time period following said first time period, followed by delivering said average value to said load.

8. The method according to claim 7, wherein said output voltage difference amplifier circuit repeats detection of said voltage change and delivery of said current or voltage to said load temporally alternately.

9. The method according to claim 7 further comprising:
  a second constant current circuit that enables a second driving current opposite in direction to said first driving circuit to be delivered to said load only when said load is at a preset state.

* * * * *

UNITED STATES PATENT AND TRADEMARK OFFICE
CERTIFICATE OF CORRECTION

PATENT NO. : 8,427,222 B2  
APPLICATION NO. : 13/410132  
DATED : April 23, 2013  
INVENTOR(S) : Yutaka Saeki Page 1 of 1

It is certified that error appears in the above-identified patent and that said Letters Patent is hereby corrected as shown below:

On the Title Page, Item (30) should read

-- Foreign Application Priority Data

Jul. 18, 2008  (JP).................................................... 2008-187083 --

Signed and Sealed this  
Twenty-fourth Day of June, 2014

Michelle K. Lee  
*Deputy Director of the United States Patent and Trademark Office*